US012776630B2

(12) United States Patent
Weltsch et al.

(10) Patent No.: US 12,776,630 B2
(45) Date of Patent: Oct. 27, 2026

(54) ELECTRONIC DEVICE INCLUDING LIQUID COOLANT CONDUIT WITH HELICAL PORTION

(71) Applicant: Mellanox Technologies Ltd., Yokneam (IL)

(72) Inventors: Oren Weltsch, Golan Heights (IL); Shay Zaretsky, Kiryat Mozkin (IL); Rom Becker, Ramat Yishai (IL); Elan Weisberg, Haifa (IL); Aviad Mazliach, Maalot Tarshiha (IL)

(73) Assignee: Mellanox Technologies Ltd., Yokneam (IL)

(*) Notice: Subject to any disclaimer, the term of this patent is extended or adjusted under 35 U.S.C. 154(b) by 217 days.

(21) Appl. No.: 18/606,119

(22) Filed: Mar. 15, 2024

(65) Prior Publication Data

US 2025/0293489 A1 Sep. 18, 2025

(51) Int. Cl.
*H05K 7/20* (2006.01)
*H02B 1/56* (2006.01)

(52) U.S. Cl.
CPC ........... *H02B 1/56* (2013.01); *H05K 7/20272* (2013.01)

(58) Field of Classification Search
CPC ........... H05K 7/20272; H05K 7/20218; H05K 7/20254; H05K 7/20263; H05K 7/20327; H05K 7/2049; H02B 1/56
See application file for complete search history.

(56) References Cited

U.S. PATENT DOCUMENTS 7,373,967 B1 * 5/2008 Tustaniwskyj .......... G06F 1/206 165/80.4
10,443,906 B2 * 10/2019 Al-Wazzan ............. F28D 15/02
11,209,214 B2 * 12/2021 Chen ................... F28D 15/0233
11,716,831 B2 * 8/2023 Kise ...................... F28D 15/025 361/700
11,934,213 B2 * 3/2024 Kao .......................... F28F 9/26
2003/0174468 A1 * 9/2003 Park ...................... H10W 40/73 165/104.33
2016/0128234 A1 * 5/2016 Uesugi ................ F28D 15/0266 165/80.4
2018/0063991 A1 * 3/2018 Hirai .................. H05K 7/20272

FOREIGN PATENT DOCUMENTS

WO WO-9427106 A1 * 11/1994 .............. F28F 13/12

OTHER PUBLICATIONS

WO-9427106-A1 Description (Year: 1994).*

* cited by examiner

*Primary Examiner* — Jayprakash N Gandhi
*Assistant Examiner* — Matthew Sinclair Muir
(74) *Attorney, Agent, or Firm* — PEARL COHEN LLP

(57) ABSTRACT

An electronic device, which may include an electronic component, a cooling body in thermal contact with the electronic component, a conduit coupled to the cooling body to deliver a coolant to or from the cooling body, the conduit comprising a coiled portion, and a coupler coupled to the coiled portion of the conduit, the coupler being removably couplable to a coolant infrastructure coupler.

17 Claims, 5 Drawing Sheets

ELECTRONIC DEVICE INCLUDING LIQUID COOLANT CONDUIT WITH HELICAL PORTION

FIELD OF THE INVENTION

The present invention relates to the field of electronic devices, and more particularly, to liquid-cooled electronic devices.

BACKGROUND OF THE INVENTION

Some electronic devices (e.g., network devices in network systems such as network switch devices) include heat producing electronic components that may require cooling. Cooling of a heat producing electronic component of an electronic device may be done by a liquid coolant. Cooling of the heat producing component by the liquid coolant typically requires coupling of the electronic device to a cooling infrastructure in a facility (e.g., data center). The electronic device typically includes a conduit through which the liquid coolant is circulated and a connector that removably connects the conduit of the electronic device to a connector of the coolant infrastructure. Due to tolerances between the position of the connector in the electronic device and the position of the coolant infrastructure connector in a rack, some mechanical flexibility may be required to allow proper connection of the connector of the electronic device to the coolant infrastructure connector. However, the conduit of the electronic device is typically formed of a rigid material. To achieve the desired flexibility, flexible hoses are typically integrated in the cooling conduit system of the electronic device. Such flexible hoses are typically connected to the conduit using barbs. However, barbs may experience an increased likelihood of corrosion and mechanical failure. Separately, a hydraulic impedance of each electronic device in the rack may need to be adjusted to achieve a desired pressure drop to flow rate ratio. To adjust the hydraulic impedance, orifices and/or heatsinks having relatively small fins pitch are typically integrated in the cooling system of the electronic device. However, such solutions may experience an increased likelihood of corrosion and clogging. Corrosion, mechanical failure and clogging may harm the proper operation of the cooling system and heat producing components of the electronic device.

SUMMARY OF THE INVENTION

Embodiments of the present invention may provide an electronic device which may include a cooling body in thermal contact with an electronic component, a conduit coupled to the cooling body to deliver a coolant to or from the cooling body, the conduit comprising a coiled portion, and a coupler coupled to the coiled portion of the conduit, the coupler being removably couplable to a coolant infrastructure coupler.

Embodiments of the present invention may provide an electronic device which may include a heat conducting body in thermal contact with a heat producing component, a tube coupled to the heat conducting body to deliver a liquid coolant to or from the heat conducting body, the tube comprising a helical portion in which the tube is bent into a helical shape, and a connector connected to the helical portion of the metal tube, the connector being removably connectable to a liquid coolant infrastructure coupler.

Embodiments of the present invention may provide an electronic device which may include a heat conducting body in thermal contact with a heat producing component, a first tube coupled to the heat conducting body to deliver a liquid coolant to the heat conducting body, the first tube comprising a helical portion in which the first tube is bent into a helical shape around a first longitudinal axis, a second tube coupled to the heat conducting body to remove the liquid coolant from the heat conducting body, the second tube comprising a helical portion in which the second tube is bent into a helical shape around a second longitudinal axis, an inlet connector connected to the helical portion of the first tube, an outlet connector connected to the helical portion of the second tube, wherein the helical portion of each of the first tube and the second tube resiliently deforms in a direction that is parallel to the respective first or second longitudinal axis, a direction that is perpendicular to the respective first or second longitudinal axis or in both directions upon connection of the respective inlet or outlet connector to a liquid coolant infrastructure coupler.

BRIEF DESCRIPTION OF THE DRAWINGS

For a better understanding of embodiments of the invention and to show how the same can be carried into effect, reference is made, purely by way of example, to the accompanying drawings in which like numerals designate corresponding elements or sections throughout. In the accompanying drawings.

Figure 1:
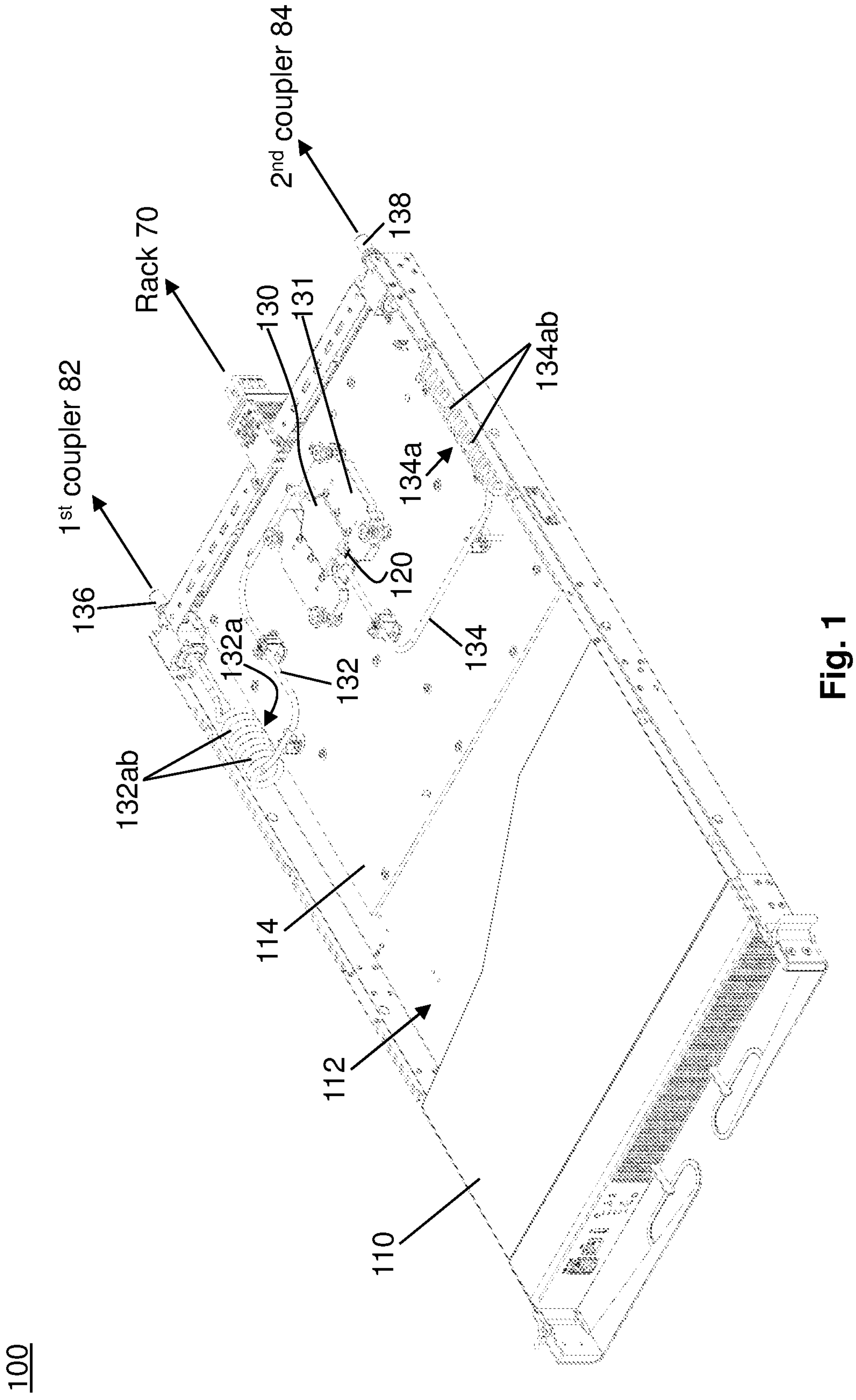
FIG. 1 is a perspective view of an electronic device, according to some embodiments of the invention.

It will be appreciated that, for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following description, various aspects of the present invention are described. For purposes of explanation, specific configurations and details are set forth in order to provide a thorough understanding of the present invention. However, it will also be apparent to one skilled in the art that the present invention can be practiced without the specific details presented herein. Furthermore, well known features can have been omitted or simplified in order not to obscure the present invention. With specific reference to the drawings, it is stressed that the particulars shown are by way of example and for purposes of illustrative discussion of the present invention only and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention can be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that can be practiced or carried out in various ways as well as to combinations of the disclosed embodiments. Also, it is to be understood that the phraseology and terminology employed herein is for the purpose of description and should not be regarded as limiting.

Embodiments of the present invention may improve a cooling system of an electronic device. The electronic device may include an electronic component (e.g., heat producing component). In operation, the electronic component may produce heat. The electronic device may include a cooling body (e.g., heat conducting body). The cooling body may be coupled to the electronic component. The cooling body may be in thermal contact with the electronic component. The electronic device may include a conduit (e.g., tube). The conduit may be coupled to the cooling body to deliver a coolant (e.g., liquid coolant) to or from the cooling body. The conduit may be formed of a rigid (e.g., non-flexible) material. The conduit may include a coiled portion (e.g., helical portion). The coiled portion of the conduit may be arranged along a central axis (e.g., longitudinal axis). The coiled portion of the conduit may include a plurality of turns (e.g., windings). Each two adjacent turns of the plurality of turns of the coiled portion of the conduit may be distanced from each other. The conduit, or at least the coiled portion of the conduit, may be formed of an elastic material such as metal (e.g., copper, stainless steel or any other suitable metal material). The coiled portion of the conduit may resiliently deform under an applied force. For example, the plurality of distanced turns formed from an elastic material may cause the coiled portion of the conduit to resiliently deform, e.g. in a spring-like manner, under the applied force. The electronic device may include a coupler (e.g., a blind-mate connector or any other suitable connector). The coupler may be coupled to the coiled portion of the conduit. For example, the coupler may be coupled directly to the coiled portion of the conduit or via a rigid (e.g., non-flexible) portion of the conduit (e.g., with no flexible hoses and/or barbs disposed between the coupler and the coiled portion of the conduit).

A facility (e.g., such as data center) may include a rack that may accommodate (e.g., removably accommodate) the electronic device. The rack may include a coolant infrastructure coupler that may couple the electronic device to a coolant infrastructure to circulate the coolant through the cooling system of the electronic device. When the electronic device is inserted into the rack, the coupler of the electronic device may be coupled (e.g., removably coupled) to the coolant infrastructure coupler. The coiled portion of the conduit may deform upon coupling of the coupler to the coolant infrastructure coupler. For example, the coiled portion of the conduit may deform (e.g., resiliently deform) in a direction that is parallel to the central axis of the coiled portion, a direction that is perpendicular to the central axis of the coiled portion or in both directions. The deformation may be at least partly due to tolerances between the position of the coupler in the electronic device and the position of the coolant conduit coupler in the rack. The number of turns of the coiled portion, the distance between adjacent turns of the coiled portion, the diameter of the coiled portion and the diameter of the conduit may be selected (e.g., predetermined) based on the desired stiffness of the coiled portion (e.g., the desired extent to which the coiled portion of the conduit resists or allows deformation in response to the applied force). The number of turns of the coiled portion, the distance between adjacent turns of the coiled portion, the diameter of the coiled portion and the diameter of the conduit may be selected (e.g., predetermined) based on the desired hydraulic impedance of the cooling conduit system of the electronic device (e.g., the desired pressure drop to flow rate ratio of the electronic device).

Advantageously, the coiled portion in the cooling conduit system of the electronic device may provide the desired flexibility of the cooling conduit system (e.g., to compensate for the tolerances as described above) while eliminating the need of having flexible hoses and barbs in the cooling conduit system. The cooling conduit system having no flexible hoses and barbs may have a reduced likelihood of corrosion and mechanical failure as compared to prior art systems. The parameters of the coiled portion may be predetermined to provide the desired hydraulic impedance of the cooling conduit system of the electronic device while eliminating the need in having orifices and/or heatsinks with relatively small fins pitch in the cooling system. A cooling system having no orifices and/or heatsinks with relatively small fins pitch may have a reduced likelihood of corrosion and clogging in the cooling system as compared to prior art system. Reduced likelihood of corrosion, mechanical failure and clogging may improve the operation of the cooling system and the electronic components of the electronic device.

Reference is made to FIG. 1, which is a perspective view of an electronic device 100, according to some embodiments of the invention.

Figure 2:
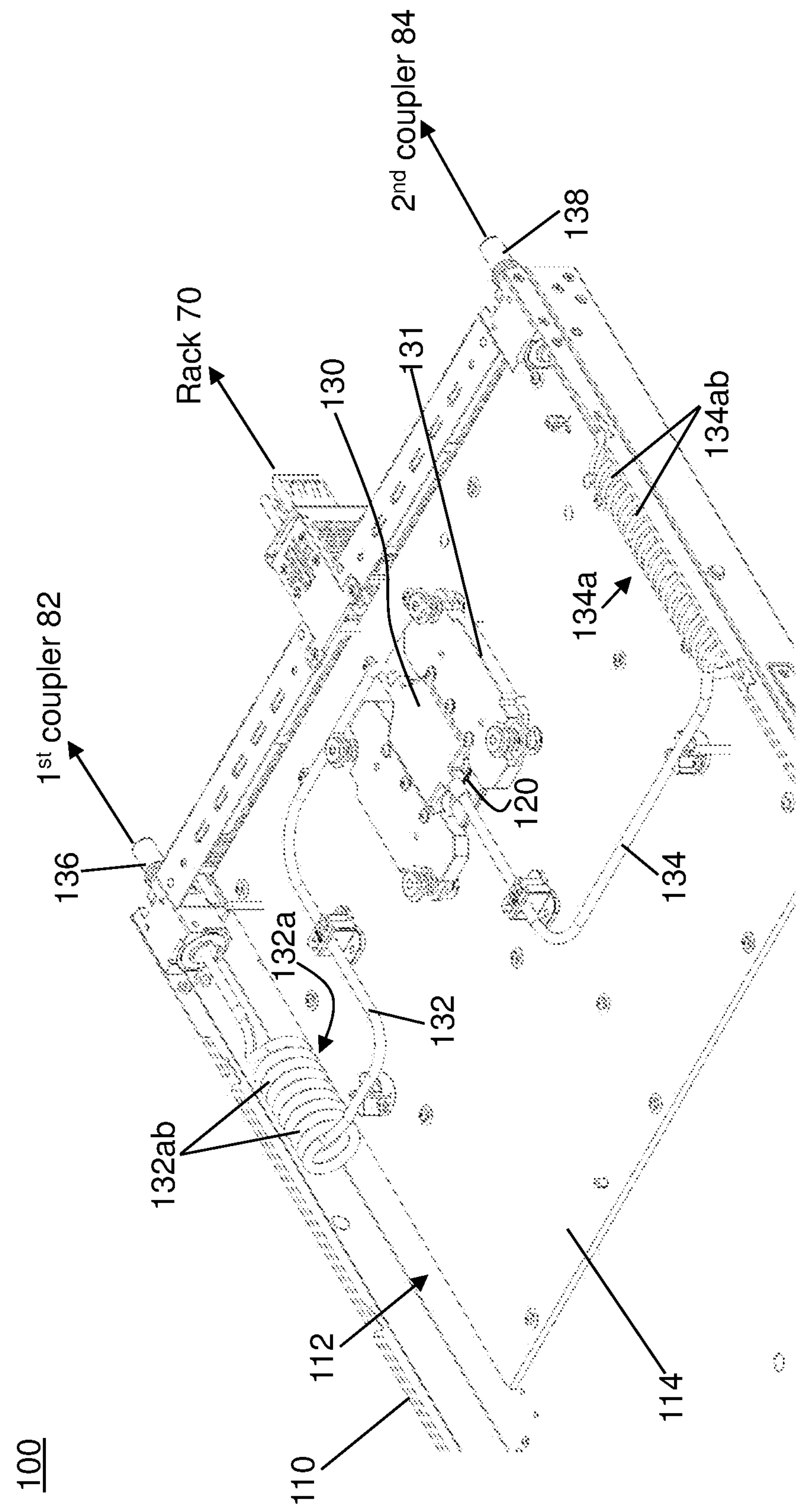
FIG. 2 is an enlarged view of the electronic device of FIG. 1, according to some embodiments of the invention.

Reference is also made to FIG. 2, which is an enlarged view of electronic device 100 of FIG. 1, according to some embodiments of the invention.

Figure 3:
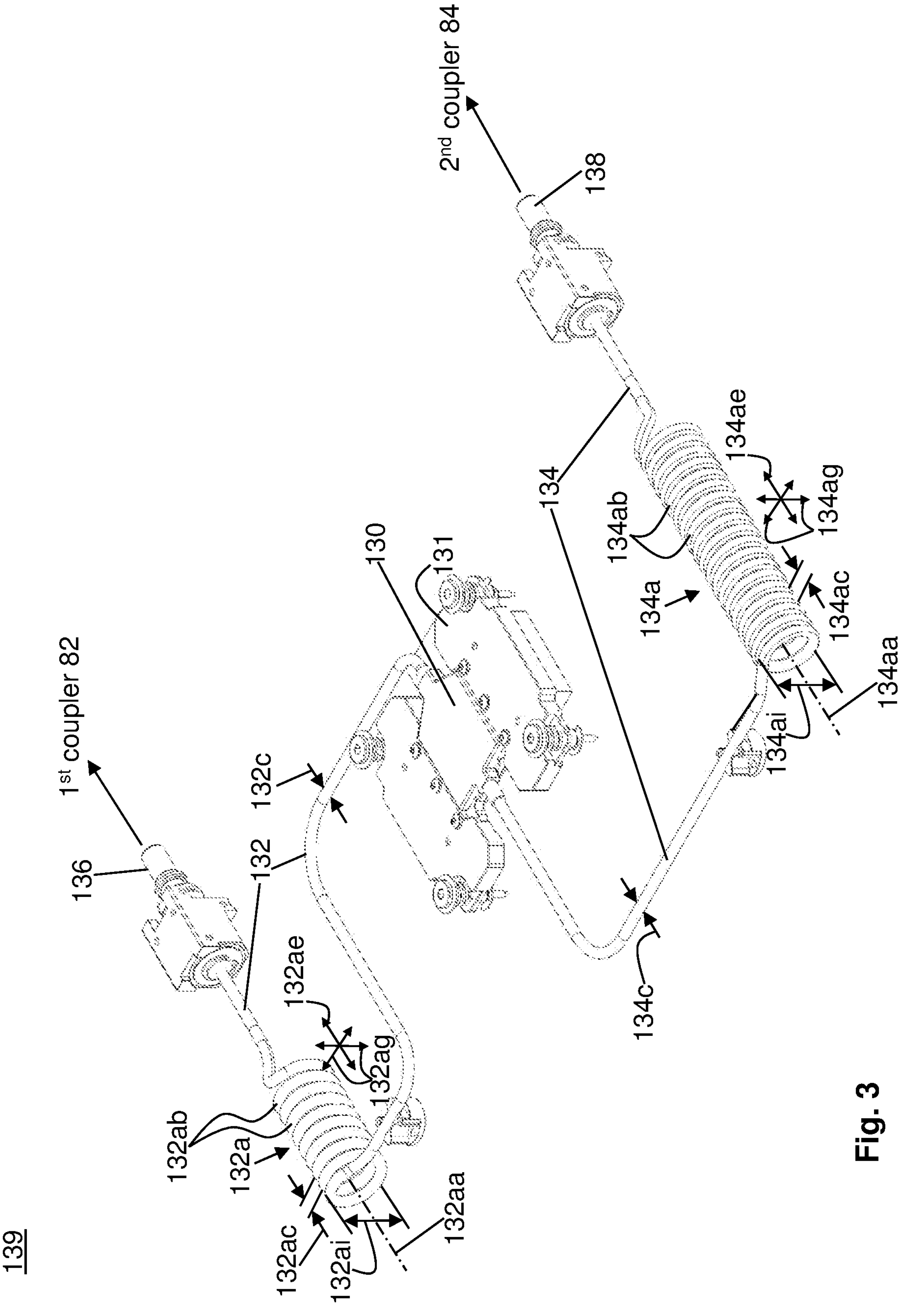
FIG. 3 is a perspective view of a cooling system of the electronic device, according to some embodiments of the invention.

Reference is also made to FIG. 3, which is a perspective view of a cooling system 139 of electronic device 100, according to some embodiments of the invention.

Electronic device 100, such as a network switch device shown in FIGS. 1-3, may include a frame (e.g., housing) 110. Frame 110 may include an interior 112. Interior 112 of frame 110 may accommodate components of electronic device 100. Electronic device 100 may include a printed circuit board (PCB) 114. PCB 114 may be disposed in interior 112 of frame 110. While network switch device is shown in FIGS. 1-3 as an example of electronic device 100, electronic device 100 may be any other suitable electronic device that may require liquid cooling (e.g., such as compute machines or servers).

Electronic device 100 may include an electronic component (e.g., heat producing component) 120. Electronic component 120 may be placed on PCB 114. In operation, electronic component 120 may produce heat. For example, electronic component 120 may be a central processing unit (CPU), graphics processing unit (GPU), networking application-specific integrated circuit (ASIC) or any other heat producing electronic component.

Electronic device 100 may include a cooling body (e.g., heat conducting body) 130. Cooling body 130 may be coupled to electronic component 120. Cooling body 130 may in thermal contact with electronic component 120.

Cooling body 130 may be made of or may include material such as, for example, copper, aluminum or stainless steel. For example, cooling body 130 may contact, directly or indirectly, electronic component 120 to cause heat to dissipate from electronic component 120 to cooling body 130. Electronic device 100 may include a sub-frame 131 to couple cooling body 130 to frame 110 and/or PCB 114 to secure the position of cooling body 130 with respect to electronic component 120. Sub-frame 131 may be coupled to frame 110 and/or PCB 114 using fasteners (e.g., such as bolts).

In the example of FIGS. 1-3, electronic device 100 includes a first conduit 132 and a second conduit 134. Each of first conduit 132 and second conduit 134 may be a pipe or a tube. Each of first conduit 132 and second conduit 134 may be formed of interconnected sections or portions (e.g., as shown in FIGS. 1-3). Each of first conduit 132 and second conduit 134 may contain a coolant, for example a liquid coolant. The coolant may, for example, be or include water (e.g., pure water) or water solutions (e.g., glycol-water). Each of first conduit 132 and second conduit 134 may be coupled to or be in contact with cooling body 130. In the example of FIGS. 1-3, first conduit 132 delivers the coolant to cooling body 130 and second conduit 134 delivers the coolant from cooling body 130. Each of first conduit 132 and second conduit 134 may be formed of a rigid (e.g., non-flexible) material.

First conduit 132 may include a coiled portion (e.g., helical portion) 132*a*. Coiled portion 132*a* may include a plurality of turns (windings) 132*ab*. Coiled portion 132*a* (e.g., turns 132*ab* of coiled portion 132*a*) may be arranged along a first central axis (e.g., first longitudinal axis) 132*aa*. Each two adjacent turns 132*ab* of the plurality of turns of coiled portion 132*a* may be distanced from each other. For example, each two adjacent turns 132*ab* of the plurality of turns of coiled portion 132*a* may be disposed at a distance 132*ac* from each other (e.g., as shown in FIG. 3). First conduit 132, or at least coiled portion 132*a*, may be formed of an elastic material such as metal (e.g., copper or stainless steel) or plastic (e.g., polyethylene terephthalate (PET) or fluorinated ethylene propylene (FEP)). Coiled portion 132*a* of first conduit 132 may resiliently deform under an applied force. For example, the plurality of distanced turns formed from an elastic material may allow coiled portion 132*a* of first conduit 132 to resiliently deform, e.g. in a spring-like manner, under the applied force.

Second conduit 134 may include a coiled portion (e.g., helical portion) 134*a*. Coiled portion 134*a* may include a plurality of turns (e.g., windings) 134*ab*. Coiled portion 134*a* (e.g., turns 134*ab* of coiled portion 132*a*) may be arranged along a second central axis (e.g., first longitudinal axis) 134*aa*. Each two adjacent turns 134*ab* of the plurality of turns of coiled portion 134*a* may be distanced from each other. For example, each two adjacent turns 134*ab* of the plurality of turns of coiled portion 134*a* may be disposed at a distance 134*ac* from each other (e.g., as shown in FIG. 3). Second conduit 134, or at least coiled portion 134*a*, may be formed of an elastic material such as metal (e.g., copper or stainless steel) or plastic (e.g., polyethylene terephthalate (PET) or fluorinated ethylene propylene (FEP)). Coiled portion 134*a* of second conduit 134 may resiliently deform under an applied force. For example, the plurality of distanced turns formed from an elastic material may allow coiled portion 134*a* of second conduit 134 to resiliently deform, e.g. in a spring-like manner, under the applied force.

While two conduits 132, 134 are shown, electronic device 100 may include any other suitable number of conduits to deliver the coolant to or from cooling body 130. For example, one conduit formed of a plurality of interconnected sections and including coiled portions 132*a*, 134*a* may be used.

In the example of FIGS. 1-3, electronic device 100 includes a first coupler (e.g., first or inlet connector) 136 and a second coupler (e.g., second or outlet connector) 138. Each of first coupler 136 and second coupler 138 may be a blind-mate connector or any other suitable connector (e.g., hot swap connector or quick disconnect connector). First coupler 136 may be coupled to coiled portion 132*a* of first conduit 132. For example, first coupler 136 may be coupled directly to coiled portion 132*a* of first conduit 132 or via a rigid (e.g., non-flexible) portion of first conduit 132 (e.g., such that no flexible hoses and/or barbs are disposed between first coupler 136 and coiled portion 132*a* of first conduit 132). Second coupler 138 may be coupled to coiled portion 134*a* of second conduit 134. For example, second coupler 138 may be coupled directly to coiled portion 134*a* of second conduit 134 or via a rigid (e.g., non-flexible) portion of second conduit 134 (e.g., such that no flexible hoses and/or barbs are disposed between second coupler 138 and coiled portion 134*a* of second conduit 134). Each of first coupler 136 and second coupler 138 may at least partly extend externally to interior 112 of frame 110 (e.g., as shown in FIGS. 1-2).

Cooling body 130, sub-frame 131, conduits 132, 134 and couplers 136, 138 may be part of a cooling system 139 of electronic device 100 (e.g., shown in FIG. 3).

Electronic device 100 may be removably insertable into a rack 70 in a facility (e.g., such as data center). Rack 70 may include a first coolant infrastructure coupler 82 and a second coolant infrastructure coupler 84. Rack 70 and coolant infrastructure couplers 82, 84 are schematically indicated in FIGS. 1-2 by arrows. When electronic device 100 is inserted into rack 70, first coupler 136 of electronic device 100 may be coupled (e.g., removably coupled) to first coolant infrastructure coupler 82 to supply the coolant from the cooling infrastructure into first conduit 132 via first coupler 136. Second coupler 138 of electronic device 100 may be coupled (e.g., removably coupled) to second coolant infrastructure coupler 84 to remove the coolant from second conduit 134 via second coupler 138 back to the cooling infrastructure. Coiled portion 132*a* of first conduit 132 may deform upon coupling of first coupler 136 to first coolant conduit coupler 82. For example, coiled portion 132*a* of first conduit 132 may deform (e.g., resiliently deform) in a direction 132*ae* that is parallel to central axis 132*aa* of coiled portion 132*a*, a direction 132*ag* that is perpendicular to central axis 132*aa* of coiled portion 132*a* or in both or some combination of these directions. The number of turns 132*ab* of coiled portion 132*a* of first conduit 132, distance 132*ac* between adjacent turns 132*ab* of coiled portion 132*a*, a diameter 132*ai* of coiled portion 132*a*, a diameter 132*c* of first conduit 132 and/or a wall thickness of first conduit 132 may be selected (e.g., predetermined) to provide the desired stiffness of coiled portion 132*a* (e.g., the desired extent to which the coiled portion of the conduit resists or allows deformation in response to the applied force). The number of turns 132*ab* of coiled portion 132*a* of first conduit 132, distance 132*ac* between adjacent turns 132*ab* of coiled portion 132*a*, a diameter 132*ai* of coiled portion 132*a* and/or a diameter (e.g., inner diameter) of first conduit 132 may be selected (e.g., predetermined) to provide the desired hydraulic impedance of coiled portion 132*a* (e.g., the desired pressure drop to flow rate ratio of coiled portion 132*a*) and/or the desired hydraulic impedance of cooling system 139 (e.g., the desired pressure drop to flow rate ratio of cooling system 139) of electronic device 100.

Coiled portion 134*a* of second conduit 134 may deform upon coupling of second coupler 138 to second coolant conduit coupler 84. For example, coiled portion 134*a* of second conduit 134 may deform (e.g., resiliently deform) in a direction 134*ac* that is parallel to central axis 134*aa* of coiled portion 134*a*, a direction 134*ag* that is perpendicular to central axis 134*aa* of coiled portion 134*a* or in both directions. The deformations may be at least partly due to tolerances between the position of couplers 136, 138 in electronic device 100 and the position of the coolant infrastructure couplers 82, 84 in rack 70. The number of turns 134*ab* of coiled portion 134*a* of second conduit 134, distance 134*ac* between adjacent turns 134*ab* of coiled portion 134*a*, a diameter 134*ai* of coiled portion 134*a*, a diameter 134*c* of second conduit 134 and/or a wall thickness of second conduit 134 may be selected (e.g., predetermined) to provide the desired stiffness of coiled portion 134*a* (e.g., the desired extent to which the coiled portion of the conduit resists or allows deformation in response to the applied force). The number of turns 134*ab* of coiled portion 134*a* of second conduit 134, distance 134*ac* between adjacent turns 134*ab* of coiled portion 134*a*, a diameter 134*ai* of coiled portion 134*a* and/or a diameter (e.g., inner diameter) of second conduit 134 may be selected (e.g., predetermined) to provide the desired hydraulic impedance of coiled portion 134*a* (e.g., the desired pressure drop to flow rate ratio of coiled portion 134*a*) and/or the desired hydraulic impedance of cooling system 139 (e.g., the desired pressure drop to flow rate ratio of cooling system 139) of electronic device 100.

Figure 4:
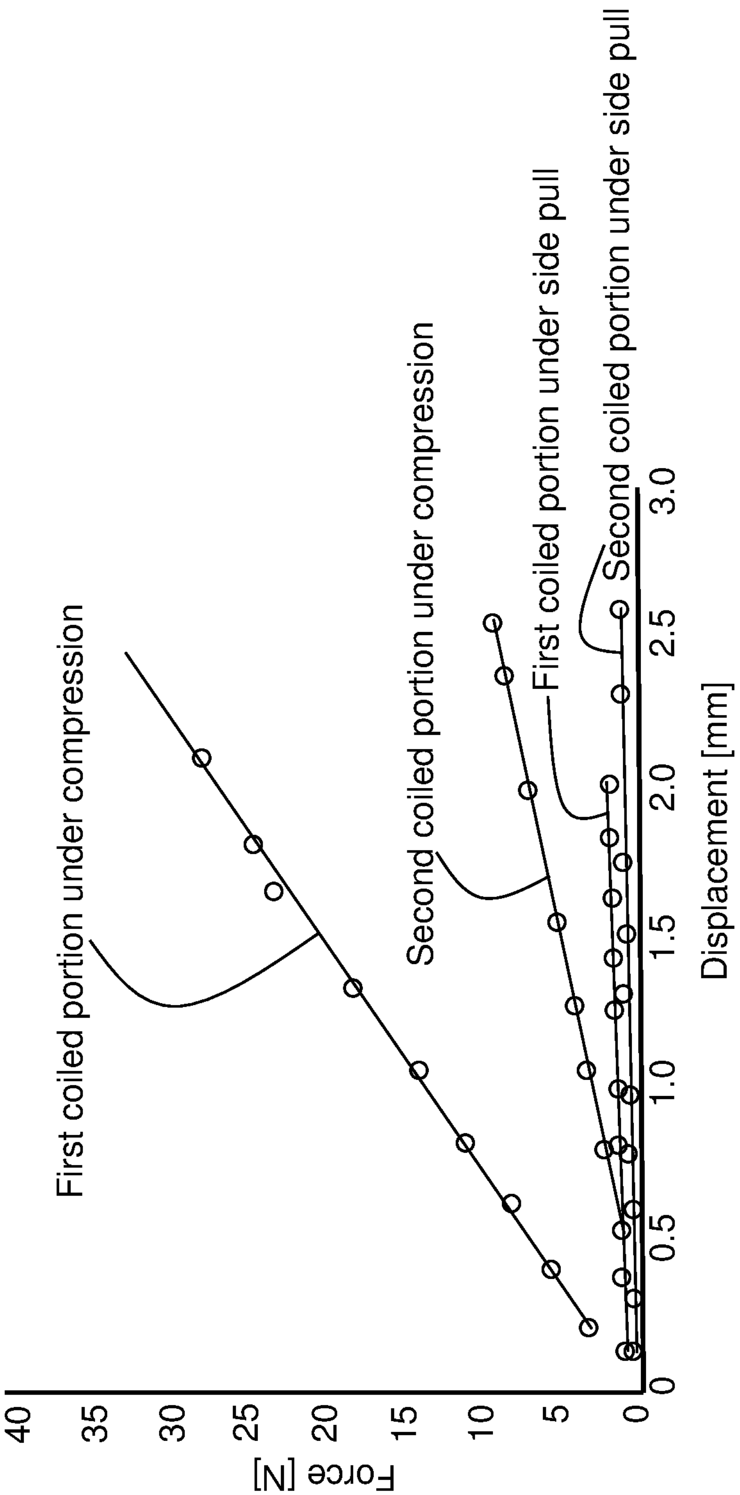
FIG. 4 is a graph showing results of compression and side pull experiment conducted on two example coiled conduit portions with different number of coils, according to some embodiments of the invention.

Reference is made to FIG. 4, which is a graph showing results of compression and side pull experiment conducted on two example coiled conduit portions with different number of coils, according to some embodiments of the invention.

In the experiment, a first coiled conduit portion (e.g., such as coiled portion 132*a* described above) having 9 turns and a second coiled conduit portion (e.g., such as coiled portion 134*a*) having 19 turns were tested. Other parameters (e.g., the material, the diameter of the coiled portion, the diameter of the conduit and the distance between adjacent turns) were the same for both the first coiled conduit portion and the second coiled conduit portion. As shown in the graph of FIG. 4, the second coiled conduit portion with smaller number of turns has greater stiffness to compression and side pull forces than the first coiled conduit portion having greater number of turns.

The desired stiffness for the coiled conduit portion (e.g., such as coiled portions 132*a*, 134*a*) may be achieved by predetermining (e.g., selecting) the parameters (e.g., such as the material, the diameter of the coiled portion, the diameter of the conduit, the wall thickness of the conduit and/or the distance between adjacent turns of the coiled portion) of the coiled conduit portion. For example, the greater the number of turns (e.g., turns 132*ab*, 134*ab*) of the coiled portion of the conduit, the smaller the stiffness of the coiled portion to compression force and/or side pull force. In another example, the greater the distance between adjacent turns of the coiled portion of the conduit (e.g., distance 132*ac*, 134*ac*), the greater the stiffness of the coiled portion to compression force and/or side pull force. In another example, the greater the diameter of the coiled portion of the conduit (e.g., diameter 132*ai*, 134*ai*), the smaller the stiffness of the coiled portion to compression force and/or side pull force. In another example, the greater the wall thickness of the conduit, the greater the stiffness of the coiled portion to compression force and/or side pull force.

Figure 5:
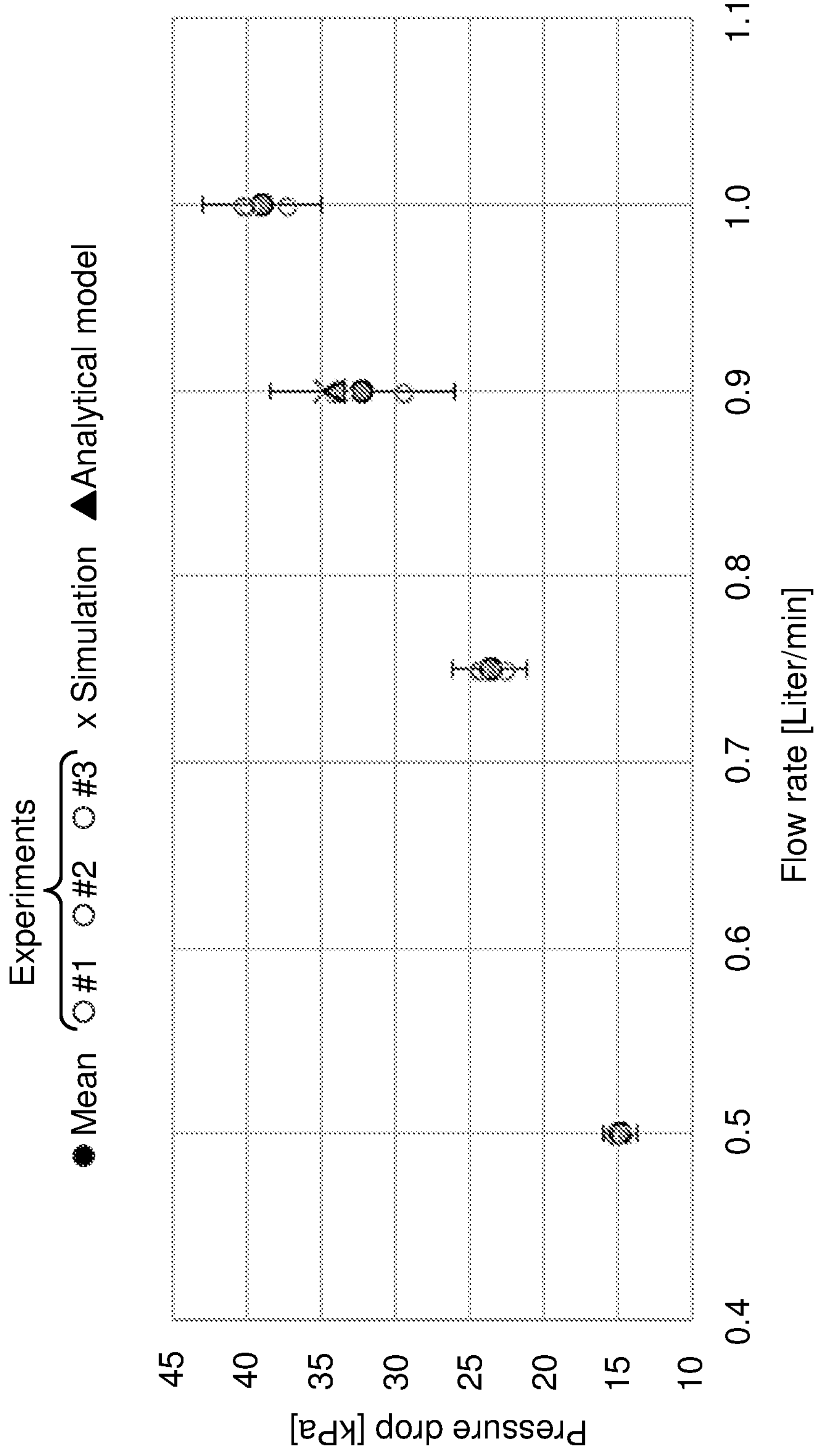
FIG. 5 is a graph showing experimental, simulation, analytical and mean results of a variation of a pressure drop over an example coiled conduit portion as function of a flow rate through the coiled conduit portion, according to some embodiments of the invention.

Reference is made to FIG. 5, which is a graph showing experimental, simulation, analytical and mean results of a variation of a pressure drop over an example coiled conduit portion as function of a flow rate through the coiled conduit portion, according to some embodiments of the invention.

The graph of FIG. 5 shows experimental, simulation, analytical results and mean of the experimental, simulation, analytical results of a variation of the pressure drop over the coiled conduit portion (e.g., such as coiled portions 132*a*, 134*a* described above) as function of the flow rate through the coiled conduit portion. The coiled conduit portion with 19 turns and a liquid at 45 degrees Celsius were used in the experiments and considered in the simulation and the analytical model.

The number of turns of coiled portions 132*a*, 134*a* of first and second conduits 132, 134, respectively, the distance between adjacent turns of coiled portions 132*a*, 134*a*, the diameter of coiled portions 132*a*, 134*a*, the diameter of first and second conduits 132, 134, respectively, and/or the diameter (e.g., the inner diameter) of first and second conduits 132, 134, respectively, may be selected (e.g., predetermined) to provide the desired hydraulic impedance of coiled portions 132*a*, 134*a* and/or the desired hydraulic impedance of cooling system 139 of electronic device 100. For example, the greater the number of turns (e.g., turns 132*ab*, 134*ab*) of the coiled portion of the conduit, the greater the hydraulic impedance of the coiled portion. In another example, the greater the diameter of the coiled portion of the conduit (e.g., diameter 132*ai*, 134*ai*), the greater the hydraulic impedance of the coiled portion. In another example, the greater the diameter (e.g., inner diameter) of the conduit, the smaller the hydraulic impedance of the coiled portion.

As described hereinabove, utilizing one or more coiled portions (e.g., such as coiled portions 132*a*, 134*a*) in the cooling conduit system of electronic device 100 may provide the desired mechanical flexibility of the cooling conduit system (e.g., to compensate for the tolerances as described above) and the desired hydraulic impedance of the cooling conduit system of electronic device 100 while eliminating the need in flexible hoses, barbs, orifices and/or heatsinks with relatively small fins pitch, thus reducing the likelihood of corrosion, mechanical failure and/or clogging in the cooling system of electronic device 100 as compared to prior art system.

In the above description, an embodiment is an example or implementation of the invention. The various appearances of "one embodiment", "an embodiment", "certain embodiments" or "some embodiments" do not necessarily all refer to the same embodiments. Although various features of the invention can be described in the context of a single embodiment, the features can also be provided separately or in any suitable combination.

Conversely, although the invention can be described herein in the context of separate embodiments for clarity, the invention can also be implemented in a single embodiment. Certain embodiments of the invention can include features from different embodiments disclosed above, and certain embodiments can incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

Although embodiments of the invention are not limited in this regard, the terms "plurality" and "a plurality" as used herein can include, for example, "multiple" or "two or more". The terms "plurality" or "a plurality" can be used throughout the specification to describe two or more components, devices, elements, units, parameters, or the like. The term set when used herein can include one or more items.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

The invention claimed is:

1. An electronic device comprising:

a heat conducting body in thermal contact with a heat producing component;

a first tube coupled to the heat conducting body to deliver a liquid coolant to the heat conducting body, the first tube comprising a helical portion in which the first tube is bent into a helical shape around a first longitudinal axis;

a second tube coupled to the heat conducting body to remove the liquid coolant from the heat conducting body, the second tube comprising a helical portion in which the second tube is bent into a helical shape around a second longitudinal axis;

an inlet connector connected to the helical portion of the first tube;

an outlet connector connected to the helical portion of the second tube;

wherein the helical portion of each of the first tube and the second tube resiliently deforms in a direction that is parallel to the respective first or second longitudinal axis, a direction that is perpendicular to the respective first or second longitudinal axis or in both directions upon connection of the respective inlet or outlet connector to a liquid coolant infrastructure coupler.

2. The electronic device of claim 1, wherein a number of windings, a distance between adjacent windings, a diameter of the helical portion of each of the first tube and the second tube, a diameter of each of the first tube and the second tube and a wall thickness of each of the first tube and the second tube are predetermined based on a desired stiffness of the respective tube.

3. The electronic device of claim 1, wherein at least one of a number of windings, a distance between adjacent windings, a diameter of the helical portion of each of the first tube and the second tube and a diameter of each of the first tube and the second tube are predetermined based on a desired fluid impedance of the electronic device.

4. An electronic device comprising:

a cooling body in thermal contact with an electronic component;

a conduit coupled to the cooling body to deliver a coolant to or from the cooling body, the conduit comprising a coiled portion; and a coupler coupled to the coiled portion of the conduit, the coupler being removably couplable to a coolant infrastructure coupler;

wherein the coiled portion of the conduit is configured to deform upon coupling of the coupler to the coolant infrastructure coupler.

5. The electronic device of claim 4, wherein the coiled portion comprises a plurality of turns, wherein each two adjacent turns of the plurality of turns are distanced from each other.

6. The electronic device of claim 4, wherein the coiled portion of the conduit is formed of an elastic material such that the coiled portion resiliently deforms under an applied force.

7. The electronic device of claim 4, wherein the coiled portion is arranged along a central axis, and wherein the coiled portion resiliently deforms in a direction that is parallel to the central axis under an applied force.

8. The electronic device of claim 4, wherein the coiled portion is arranged along a central axis, and wherein the coiled portion resiliently deforms in a direction that is perpendicular to the central axis under an applied force.

9. The electronic device of claim 1, wherein a number of turns, a distance between adjacent turns, a diameter of the coiled portion, a diameter of the conduit and a wall thickness of the conduit are predetermined based on a desired stiffness of the coiled portion of the conduit.

10. The electronic device of claim 4, wherein at least one of a number of turns, a distance between adjacent turns, a diameter of the coiled portion of the conduit and a diameter of the conduit are predetermined based on a desired fluid impedance of the electronic device.

11. The electronic device of claim 4, comprising a frame having an interior, wherein at least a portion of the coupler extends externally to the interior of the frame.

12. An electronic device comprising:

a heat conducting body in thermal contact with a heat producing component;

a tube coupled to the heat conducting body to deliver a liquid coolant to or from the heat conducting body, the tube comprising a helical portion in which the tube is bent into a helical shape; and a connector connected to the helical portion of the tube, the connector being removably connectable to a liquid coolant infrastructure coupler;

wherein the helical portion of the tube is configured to deform upon coupling of the connector to the liquid coolant infrastructure coupler.

13. The electronic device of claim 12, wherein each two adjacent windings of the helical portion of the tube are distanced from each other.

14. The electronic device of claim 12, wherein the helical portion is arranged around a longitudinal axis, and wherein upon connection of the connector to the liquid coolant infrastructure coupler, the helical portion of the tube resiliently deforms in a direction that is parallel to the longitudinal axis, a direction that is perpendicular to the longitudinal axis or in both directions.

15. The electronic device of claim 12, wherein a number of windings, a distance between adjacent windings, a diameter of the helical portion of the tube, a diameter of the tube and a wall thickness of the tube are predetermined based on a desired stiffness of the helical portion of the tube.

16. The electronic device of claim 12, wherein at least one of a number of windings, a distance between adjacent windings, a diameter of the helical portion of the tube, a diameter of the tube are predetermined based on a desired fluid impedance of the electronic device.

17. The electronic device of claim 12, comprising a housing, the housing comprises an interior accommodating the heat producing component, the heat conducting body and the tube, wherein at least a portion of the connector extends externally to the interior of the housing.

* * * * *